United States Patent
Ooi et al.

(10) Patent No.: US 11,949,039 B2
(45) Date of Patent: Apr. 2, 2024

(54) OPTOELECTRONIC SEMICONDUCTOR DEVICE WITH NANOROD ARRAY

(71) Applicant: KING ABDULLAH UNIVERSITY OF SCIENCE AND TECHNOLOGY, Thuwal (SA)

(72) Inventors: Boon S. Ooi, Thuwal (SA); Aditya Prabaswara, Thuwal (SA); Jung-Wook Min, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 475 days.

(21) Appl. No.: 17/290,525

(22) PCT Filed: Nov. 4, 2019

(86) PCT No.: PCT/IB2019/059453
§ 371 (c)(1),
(2) Date: Apr. 30, 2021

(87) PCT Pub. No.: WO2020/095179
PCT Pub. Date: May 14, 2020

(65) Prior Publication Data
US 2021/0376184 A1    Dec. 2, 2021

Related U.S. Application Data

(60) Provisional application No. 62/755,659, filed on Nov. 5, 2018.

(51) Int. Cl.
*H01L 33/00* (2010.01)
*H01L 27/15* (2006.01)
(Continued)

(52) U.S. Cl.
CPC .......... *H01L 33/007* (2013.01); *H01L 27/156* (2013.01); *H01L 33/06* (2013.01);
(Continued)

(58) Field of Classification Search
None
See application file for complete search history.

(56) References Cited

U.S. PATENT DOCUMENTS 7,091,514 B2    8/2006   Craven et al.
7,186,302 B2    3/2007   Chakraborty et al.
(Continued)

FOREIGN PATENT DOCUMENTS

JP    2017088454 A   *   5/2017

OTHER PUBLICATIONS

Bougrioua, Z., et al., "Growth of Freestanding GaN Using Pillar-Epitaxial Lateral Overgrowth from GaN Nanocolumns," Journal of Crystal Growth, Sep. 29, 2007, vol. 309, pp. 113-120, Elsevier B.V.
(Continued)

*Primary Examiner* — Nduka E Ojeh
(74) *Attorney, Agent, or Firm* — PATENT PORTFOLIO BUILDERS PLLC (57) ABSTRACT

A method of forming an optoelectronic semiconductor device involves providing an amorphous substrate. A transparent and conductive oxide layer is deposited on the amorphous substrate. The transparent and conductive oxide layer is annealed to form an annealed transparent and conductive oxide layer having a cubic-oriented and/or rhombohedral-oriented surface. A nanorod array is formed on the cubic-oriented and/or rhombohedral-oriented surface of the annealed transparent and conductive oxide layer. The annealing of the transparent conductive oxide layer and the formation of the nanorod array are performed using molecu-
(Continued)

lar beam epitaxy (MBE). The nanorods of the nanorod array comprise a group-III material and are non-polar.

18 Claims, 6 Drawing Sheets

(51) Int. Cl.

| | | |
|---|---|---|
| H01L 33/06 | (2010.01) | |
| H01L 33/08 | (2010.01) | |
| H01L 33/18 | (2010.01) | |
| H01L 33/24 | (2010.01) | |
| H01L 33/32 | (2010.01) | |
| H01L 33/42 | (2010.01) | |

(52) U.S. Cl.
CPC .............. *H01L 33/08* (2013.01); *H01L 33/18* (2013.01); *H01L 33/24* (2013.01); *H01L 33/42* (2013.01); *H01L 33/32* (2013.01); *H01L 2933/0016* (2013.01)

(56) References Cited

U.S. PATENT DOCUMENTS

| | | | |
|---|---|---|---|
| 7,220,658 | B2 | 5/2007 | Haskell et al. |
| 7,427,555 | B2 | 9/2008 | Haskell et al. |
| 7,670,933 | B1 | 3/2010 | Wang et al. |
| 8,247,887 | B1 | 8/2012 | Raring et al. |
| 8,629,065 | B2 | 1/2014 | Spiberg et al. |
| 9,153,737 | B2 * | 10/2015 | Nam .................. H01L 31/0304 |
| 2009/0081857 | A1 | 3/2009 | Hanser et al. |
| 2011/0108954 | A1 | 5/2011 | Spiberg et al. |
| 2012/0319083 | A1 * | 12/2012 | Lee .................. H01L 21/02422 |
| | | | 438/455 |
| 2013/0200391 | A1 * | 8/2013 | Bedair .................... H01L 33/22 |
| | | | 438/494 |
| 2018/0248077 | A1 | 8/2018 | Ooi et al. |
| 2018/0374988 | A1 * | 12/2018 | Mi ...................... H01L 33/0025 |

OTHER PUBLICATIONS

Chen, L., et al., "Photoluminescence of GaInN/GaN Multiple Quantum Well Heterostructures on Amorphous Surface Through Biaxial Metal Buffer Layers," Nano Energy, Feb. 2, 2014, vol. 5, pp. 1-8, Elsevier Ltd.

Chen, Y.-S., et al., "Threading Dislocation Evolution in Patterned GaN Nanocolumn Growth and Coalescence Overgrowth," Journal of Applied Physics, Jul. 23, 2009, vol. 106, pp. 023521-1-023521-6, American Institute of Physics.

International Search Report in corresponding/related International Application No. PCT/IB2019/059453, dated Jan. 16, 2020.

Jeong, H., et al., "Light-Extraction Enhancement of a GaN-Based LED Covered with ZnO Nanorod Arrays," Nanoscale, Jan. 19, 2014, vol. 6, pp. 4371-4378, The Royal Society of Chemistry.

Kato, K., et al., "Overgrowth of GaN on Be-Doped Coalesced GaN Nanocolumn Layer by Rf-Plasma-Assisted Molecular-Beam Epitaxy-Formation of High-Quality GaN Microcolumns," Journal of Crystal Growth, Jan. 19, 2009, vol. 311, pp. 2956-2961, Elsevier B.V.

Kuo, C.H., et al., "Efficiency Improvement of Near-Ultraviolet Nitride-Based Light-Emitting-Diode Prepared on GaN Nano-Rod Arrays by Metalorganic Chemical Vapor Deposition," IEEE Journal of Quantum Electronics, Mar. 2014, vol. 50, No. 3, pp. 129-132, IEEE.

Kusakabe, K., et al., "Overgrowth of GaN Layer on GaN Nano-Columns by RF-Molecular Beam Epitaxy," Journal of Crystal Growth, Apr. 2002, vol. 237-239, Part 2, pp. 988-992, Elsevier Science B.V.

Li, Q., et al., "Nanowire-Templated Lateral Expitaxial Growth of Low-Dislocation Density Nonpolar a-Plane GaN on r-Plane Sapphire," Advanced Materials, 2009, vol. 21, pp. 2416-2420, WILEY-VCH Verlag GmbH & Co. KGaA, Weinheim.

Prabaswara, A., et al., "Direct Growth of III-Nitride Nanowire-Based Yellow Light-Emitting Diode on Amorphous Quartz Using Thin Ti Interlayer," Nanoscale Research Letters, Feb. 6, 2018, vol. 13, 9 pages, Springer.

Prabaswara, A., et al., "Direct Growth of Single Crystalline GaN Nanowires on Indium Tin Oxide-Coated Silica," Nanoscale Research Letters, Feb. 5, 2019, vol. 14, 7 pages, Springer.

Riley, J.R., et al., "Three-Dimensional Mapping of Quantum Wells in a GaN/InGaN Core-Shell Nanowire Light-Emitting Diode Array," Nano Letters, Aug. 6, 2013, pp. 4317-4325, American Chemical Society.

Shon, J.W., et al., "Fabrication of Full-Color InGaN-Based Light-Emitting Diodes on Amorphous Substrates by Pulsed Sputtering," Scientific Reports, Jun. 23, 2014, 4 pages.

Written Opinion of the International Searching Authority in corresponding/related International Application No. PCT/IB2019/059453, dated Jan. 16, 2020.

Wu, Y., et al., "Molecular Beam Epitaxy and Characterization of Mg-Doped GaN Epilayers Grown on Si (0 0 1) Substrate Through Controlled Nanowire Coalescence," Journal of Crystal Growth, Jun. 15, 2018, vol. 498, pp. 109-114, Elsevier B.V.

Yang, T.H., et al., "Growth of Free-Standing GaN Layer on Si(III) Substrate," Journal of Crystal Growth, Nov. 8, 2008, vol. 311, pp. 1997-2001, Elsevier B.V.

\* cited by examiner

OPTOELECTRONIC SEMICONDUCTOR DEVICE WITH NANOROD ARRAY

CROSS-REFERENCE TO RELATED APPLICATIONS

This application is a U.S. National Stage Application of International Application No. PCT/IB2019/059453, filed on Nov. 4, 2019, which claims priority to U.S. Provisional Patent Application No. 62/755,659, filed on Nov. 5, 2018, entitled "GROWTH OF CLOSELY-PACKED NON-POLAR GaN ON INDIUM TIN OXIDE INTERLAYER AND OVERGROWN PLANAR GaN LAYER TEMPLATE ON AMORPHOUS GLASS SUBSTRATE," the disclosures of which are incorporated herein by reference in their entirety.

BACKGROUND

Technical Field

Embodiments of the disclosed subject matter generally relate to optoelectronic semiconductor devices having improved quantum efficiency.

Discussion of the Background

Optoelectronic semiconductor devices, such as light-emitting devices, are finding increased usage across a wide variety of applications. For example, light-emitting diodes are now used in place of incandescent light sources in light bulbs, displays, and the like. Group-III nitride-based materials are widely used in light-emitting optoelectronic devices due to their ability to produce ultraviolet, visible, and near-infrared light.

Conventionally, group-III nitride-based materials are arranged in a c-plane (0001) orientation in light-emitting optoelectronic semiconductor devices due to the ease of production of these materials in the c-plane orientation. One problem with the c-plane orientation is that the internal piezoelectric polarization field inherent in group-III nitride-based materials causes the quantum confined Stark effect (QCSE), which reduces the overlap between the wavefunctions of electrons and holes in the device active region. This reduces quantum efficiency at longer emission wavelengths, and thus these devices are not efficient at converting electricity into light.

It has been recognized that the internal piezoelectric polarization field inherent in group-III nitride-based materials can be eliminated by growing III-nitride materials in a direction perpendicular to the c-plane, which for gallium nitride (GaN) and aluminum nitride (AlN) single crystal substrates is either the a- or m-plane. Conventional techniques for achieving an a- or m-plane orientation are extremely costly and limited to small substrate sizes.

For example, Reference 1 discloses growing GaN nanowires on a sapphire substrate using nickel (Ni) catalysts and then forming a GaN film on the GaN nanowires. This requires the use of r-plane sapphire to grow the nonpolar a-plane GaN film. Supplies of r-plane sapphire substrates are limited due the expense in producing these substrates. Further, r-plane sapphire substrates do not provide the required electrical conductivity to the a-plane GaN film, and thus require a number of micrometer thick n-GaN layers to be grown to achieve the required electrical conductivity. Further, this only allows for implementing a lateral current-injection geometry in an optoelectronic device, which can cause a current crowding effect near the metal contact layer on the n-GaN layer, and thus generates heat and degrades device efficiency.

Thus, there is a need for an optoelectronic semiconductor device that can be produced cost-efficiently while having an improved quantum efficiency compared to conventional devices using c-plane orientation of III-nitride materials.

SUMMARY

According to an embodiment, there is a method of forming an optoelectronic semiconductor device. An amorphous substrate is provided, and a transparent and conductive oxide layer is deposited on the amorphous substrate. The transparent and conductive oxide layer is annealed to form an annealed transparent and conductive oxide layer having a cubic-oriented and/or rhombohedral-oriented surface. A nanorod array is formed on the cubic-oriented and/or rhombohedral-oriented surface of the annealed transparent and conductive oxide layer. The annealing of the transparent conductive oxide layer and the formation of the nanorod array are performed using molecular beam epitaxy (MBE). The nanorods of the nanorod array comprise a group-III material and are non-polar.

According to another embodiment, there is an optoelectronic semiconductor device, which includes an amorphous substrate, a transparent and conductive oxide layer having a cubic-oriented and/or rhombohedral-oriented surface and arranged on the amorphous substrate, and a nanorod array arranged on the cubic-oriented and/or rhombohedral-oriented surface of the transparent and conductive oxide layer. The nanorods of the nanorod array comprise a group-III material and are non-polar.

According to a further embodiment, there is an optoelectronic semiconductor system, which includes a voltage source and an array of optoelectronic semiconductor devices coupled to the voltage source. Each of optoelectronic semiconductor devices includes an amorphous substrate, a transparent and conductive oxide layer having a cubic-oriented and/or rhombohedral-oriented surface and arranged on the amorphous substrate, and a nanorod array arranged on the cubic-oriented and/or rhombohedral-oriented surface of the transparent and conductive oxide layer. The nanorods of the nanorod array comprise a group-III material and are non-polar.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of optoelectronic semiconductor devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
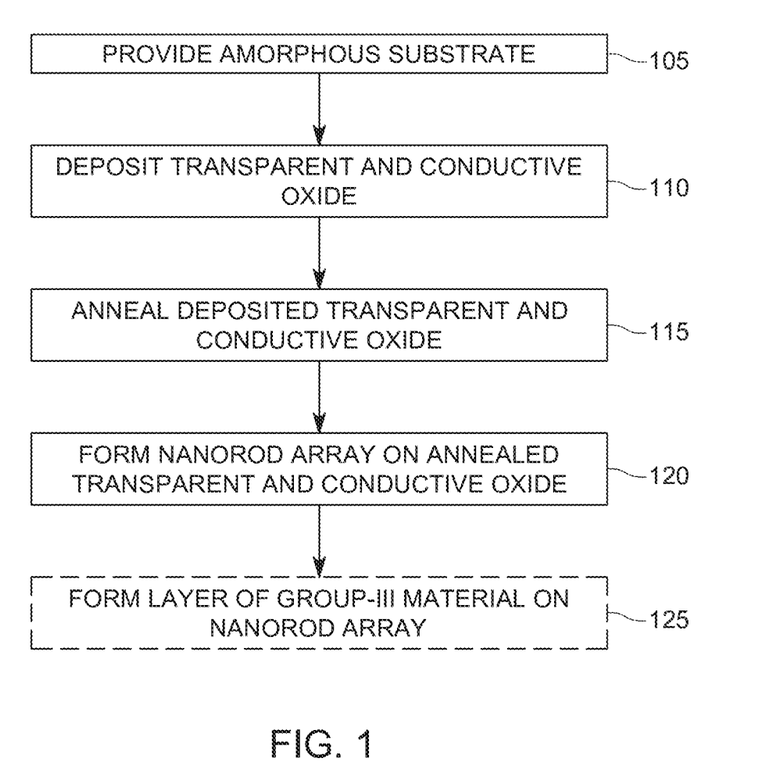
FIG. 1 is a flowchart of a method of forming an optoelectronic semiconductor device according to embodiments.

FIG. 1 is a flowchart of a method of forming an optoelectronic semiconductor device according to embodiments, which will be described in connection with the schematic diagrams of FIGS. 2A-2D. Initially, an amorphous substrate 205 is provided (step 105). A transparent and conductive oxide layer is deposited on the amorphous substrate 205 (step 110). The transparent and conductive oxide layer is annealed to form an annealed transparent and conductive oxide layer 210 having a cubic-oriented and/or rhombohedral-oriented surface (step 115). A nanorod array 215 is formed on the cubic-oriented and/or rhombohedral-oriented surface of the annealed transparent and conductive oxide layer 210 (step 120). The annealing (step 115) of the transparent and conductive oxide layer 210 and the formation (step 120) of the nanorod array are performed using molecular beam epitaxy (MBE). The nanorods of the nanorod array 215 comprise a group-III material and are non-polar. The nanorods of the nanorod array 215 can achieve the non-polarity by having an a-plane or m-plane orientation. The transparent and conductive oxide layer provides for a vertical current-injection geometry allowing uniform current flow along the vertical direction of the device (i.e., from top to bottom), which improves device efficiency compared to the lateral current-injection geometry of devices employing r-plane sapphire substrates.

Figure 2A:
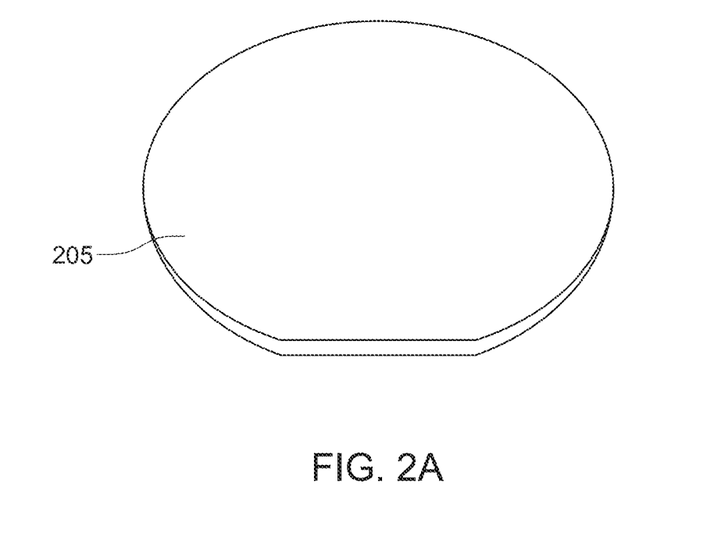
FIGS. 2A-2D are schematic diagrams of a method of forming an optoelectronic semiconductor device according to embodiments.
Figure 2B:
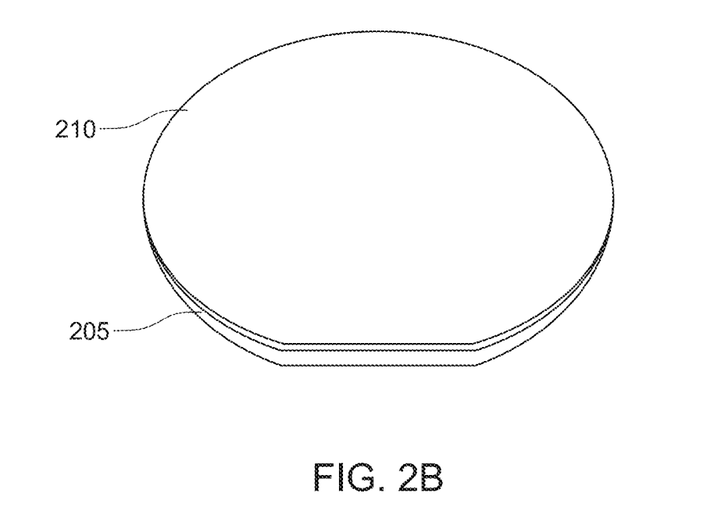
Figure 2C:
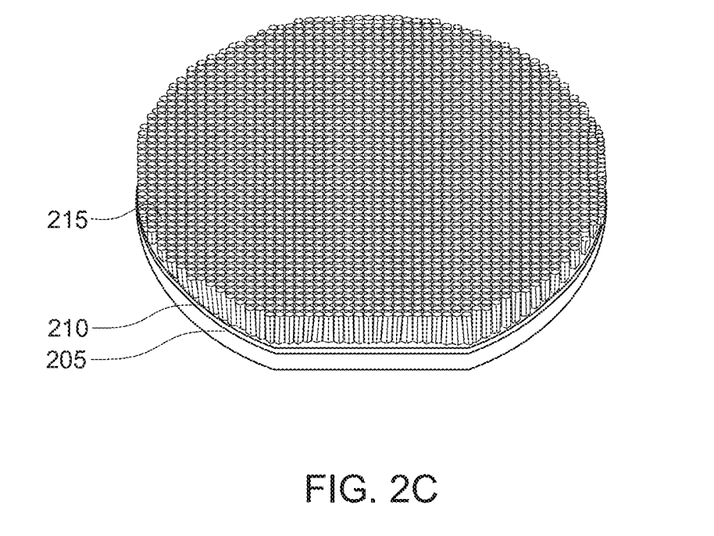
Figure 2D:
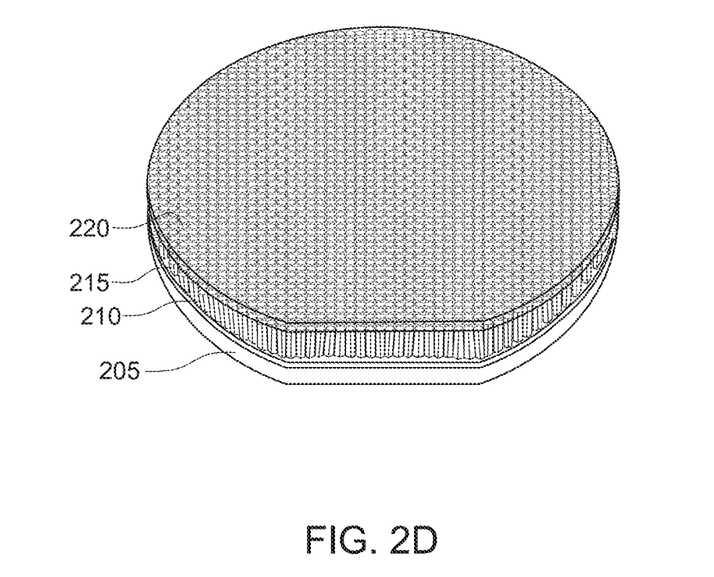

The deposited transparent and conductive oxide layer 210 includes coalescent columnar grains formed as a planar layer and the molecular beam epitaxy annealing improves the crystallinity of, and increases the grain size within, an upper portion of the transparent and conductive oxide layer 210 so as to enhance the formation of the cubic-oriented and/or rhombohedral-oriented surface that is favorable for subsequent formation of the a-plane nanorod array 215. The molecular beam epitaxy also accommodates the selective area growth (SAG) required to form the nanorods of the nanorod array 215. The transparent and conductive oxide layer 210 can be any type of transparent and conductive oxide layer, which after annealing, exhibits the cubic-oriented and/or rhombohedral-oriented surface. This layer 210 can comprise, for example, tin-doped indium oxide, ITO, or fluorine-doped tin oxide, FTO. Due to the cubic-oriented and/or rhombohedral-oriented surface of the transparent and conductive oxide layer 210, the nanorod array comprised of a group-III material formed on the layer 210 exhibit an a-plane or m-plane orientation during growth. Specifically, the stacking orders of the group-III material of the nanorods follow the atomic sequence of the underlying transparent and conductive oxide layer 210 and the group-III material has its growth direction as non-polar, i.e., a-plane or m-plane. This a-plane or m-plane orientation results in minimal or no strain between the nanorods of the nanorod array 215 and the transparent and conductive oxide layer 210 (i.e., the nanorods of the nanorod array 215 are non-polar), which addresses the quantum confined Stark effect issues when the nanorods have the conventional c-plane orientation. Further, the a-plane or m-plane orientation allows for an increased volume of the quantum well to 6-8 nm while maintaining an optimal spatial overlap of the electron- and hole-wavefunctions so long as the quantum confinement effect and the lattice-mismatch between a quantum well and quantum barrier are maintained. In contrast, with a conventional c-plane orientation the quantum well volume is typically limited to 2-3 nm in order to achieve the necessary spatial overlap of electron- and hole-wave functions required for high efficiency devices. The increased volume of the quantum well further increases the efficiency of the device.

The transparent and conductive oxide layer 210 can be deposited using physical vapor deposition, e-beam evaporation, sputter deposition, and the like. Moreover, in an embodiment, the transparent and conductive oxide layer 210 can be annealed prior to the annealing using molecular beam epitaxy. This can involve, for example, rapid thermal annealing (RTA) in an oxygen-depleted or vacuum environment or an argon ambient.

Figure 3A:
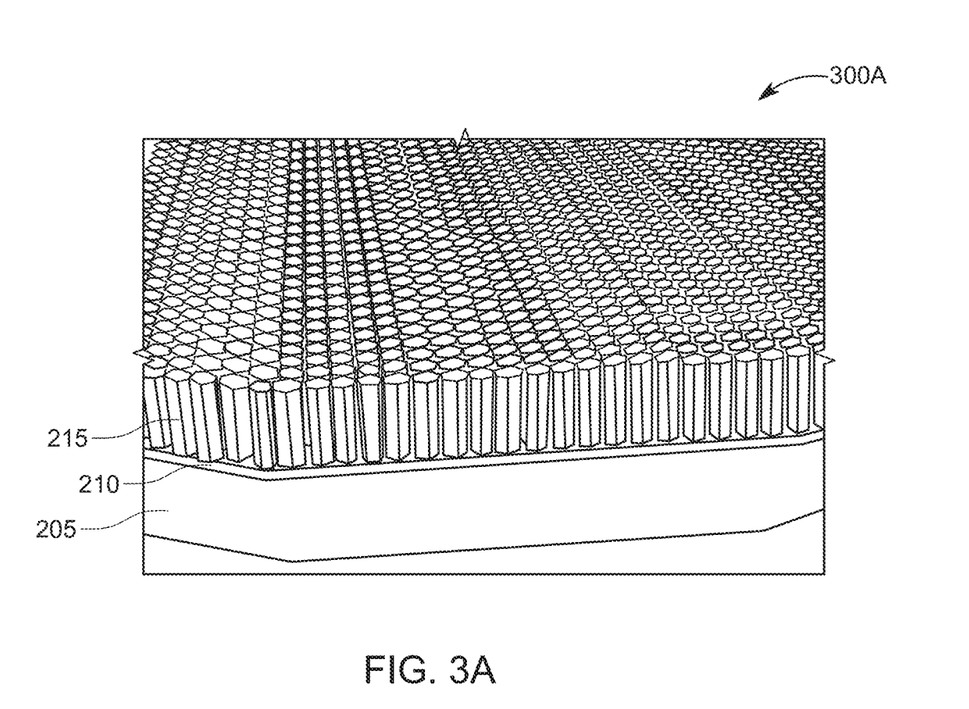
FIGS. 3A and 3B are schematic diagrams of optoelectronic semiconductor devices according to embodiments.

An optoelectronic semiconductor device formed by steps 105-120 of FIG. 1 is illustrated in FIG. 3A. As illustrated, the device 300A includes an amorphous substrate 205 and a transparent and conductive oxide layer 210 having a cubic-oriented and/or rhombohedral-oriented surface and arranged on the amorphous substrate 205. The amorphous substrate 205 can be any type of transparent amorphous substrate such as, for example, an amorphous glass substrate comprising fused silica or quartz. The transparent and conductive oxide layer 210 acts as a pre-orienting layer for forming the non-polar (i.e., a-plane or m-plane orientated) nanorod array and the layer of group-III material (if employed) and also provide the necessary conductivity for the device.

A nanorod array 215 is arranged on the cubic-oriented and/or rhombohedral-oriented surface of the transparent and conductive oxide layer 210. Nanorods of the nanorod array 215 comprise a group-III material and are non-polar. The non-polarity can be achieved by the nanorods having an a-plane or m-plane orientation. The group-III material of the nanorod array 215 can be a group-III nitride or group-III oxide, including ternary and quaternary compositions. It will be recognized that due to cost and availability issues, non-polar aluminum nitrides, gallium nitrides, and indium nitride materials are particularly advantageous.

Each of the nanorods in the nanorod array 215 can be, for example, nanorod crystals having a micron- or sub-micron (i.e., 0.1-1 μm) diameter and non-polar group-III materials with an a-plane or m-plane orientation. The nanorod array 215 can be grown in a randomly distributed manner or a dielectric mask can be employed so that the nanorod array 215 is a well-aligned array. Forming the nanorod array 215 so that it is a well-aligned array can involve, for example, forming a mask layer on the annealed transparent and conductive oxide layer 210 prior to forming the nanorod array 215 and removing the mask layer after forming the nanorod array 215. The nanorods of the well-aligned nanorod array 215 can be individually addressable micro- or sub-micron-sized non-polar light-emitting diodes, which can be used, for example, in high-density augmented displayed devices. Thus, the device formed so far can be referred to as a light-emitting optoelectronic device.

Returning to FIGS. 1 and 2D, the optoelectronic semiconductor device can also be designed as a large-area light-emitting diode in the form of a continuous layer. Specifically, a layer of non-planar, a-plane or m-plane group-III material 220 can be formed on the nanorod array 215 (step 125). The formation of the layer of group-III material 220 can employ a molecular beam epitaxy (MBE), metal-organic chemical vapor deposition (MOCVD), liquid phase epitaxy (LPE), hydride vapor phase epitaxy (HVPE) sublimation, or plasma-enhanced chemical vapor deposition (PECVD) process.

Figure 3B:
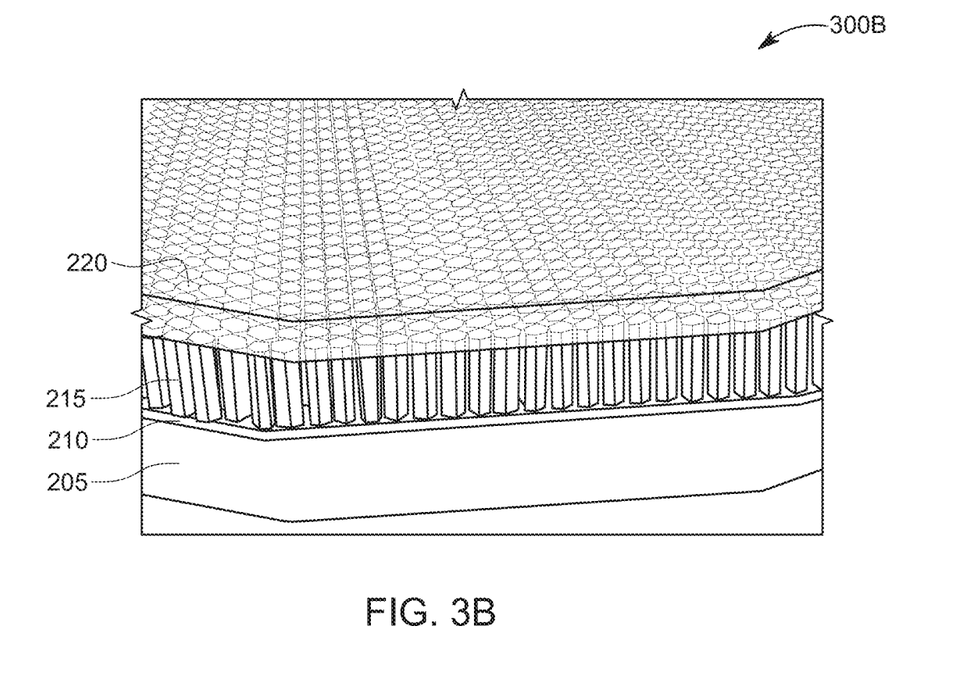

This step is an optional step and can be omitted if the device illustrated in FIG. 3A is desired. The resulting device is illustrated in FIG. 3B, which shows the layer of group-III material 220 formed on the nanorod array 215. Because the nanorods of the nanorod array 215 are formed having an a-plane or m-plane orientation, the layer of group-III material 220 will also exhibit an a-plane or m-plane orientation, respectively. The device resulting from the additional layer of group-III material 220 can be an optoelectronic light-emitting device, such as a light-emitting diode or laser diode, an optoelectronic modulator, optoelectronic photodetector, optoelectronic solar and photovoltaic cell, part of a micro-LED display, used for photoelectrochemical water-splitting, an optical amplifier, nano-laser, etc.

Figure 4:
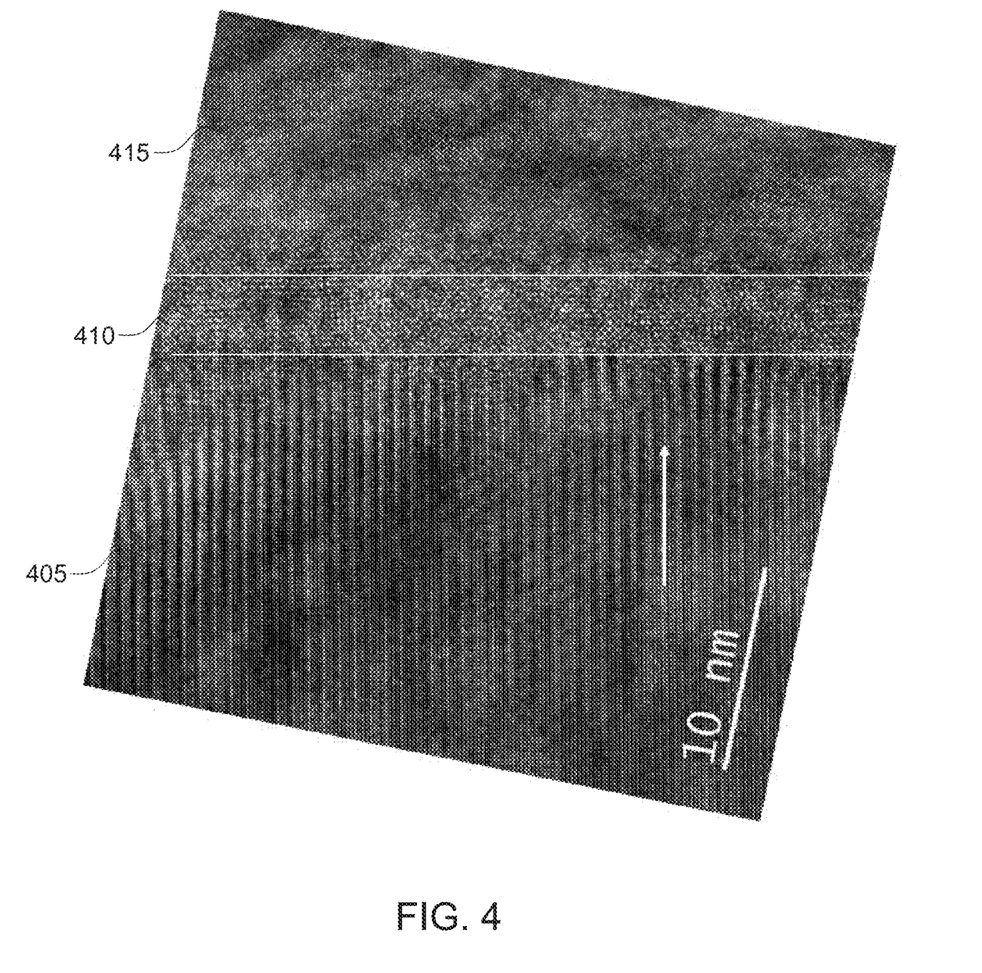
FIG. 4 is a high-resolution transmission electron microscopy (HR-TEM) image of an optoelectronic semiconductor device according to embodiments.

FIG. 4 is a high-resolution transmission electron microscopy (HR-TEM) image of an optoelectronic semiconductor device formed using the method described above according to embodiments. The vertical arrow illustrates the growth direction. As illustrated, the lower portion 405 comprises the transparent and conductive substrate, which in the illustrated example is tin-doped indium oxide. The annealing causes an upper portion 410 of the transparent and conductive substrate to form a partially amorphous crystalline layer on which III-nitride nanorod array 415 is grown, which in the illustrated example is a gallium nitride nanorod array with a-plane oriented along the growth direction, which is realized using non-polar group-III materials. Testing of the sample illustrated in FIG. 4 revealed that the gallium nitride material had a high crystalline quality. Further, there was an absence of stacking faults in the sample, demonstrating that the non-polar group-III material was defect-free.

Figure 5:
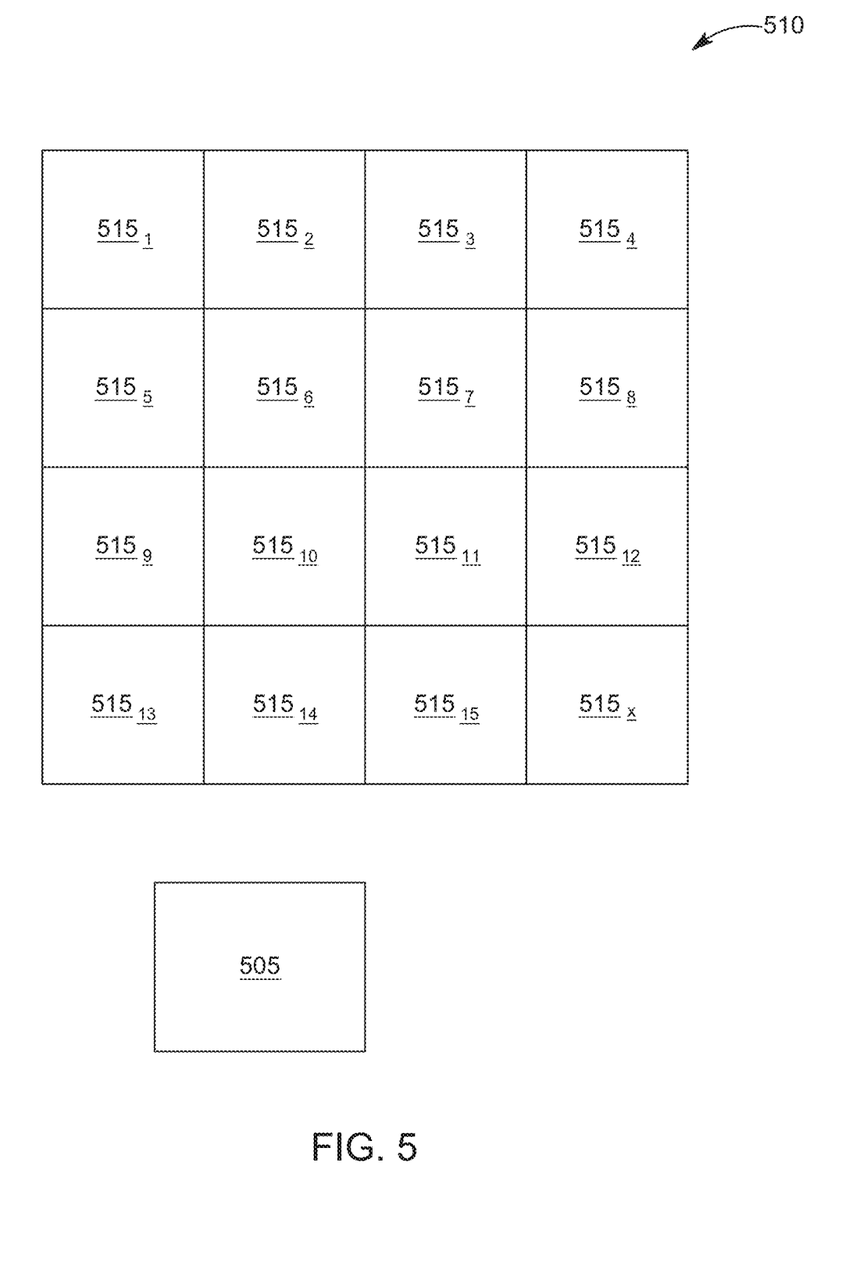
FIG. 5 is a schematic diagram of an optoelectronic semiconductor system according to embodiments.

In addition to employing individual optoelectronic semiconductor devices formed in the manner described above, a number of such devices can be employed together to form an optoelectronic semiconductor system, an example of which is illustrated in FIG. 5. The system includes a voltage source 505 electrically coupled (the electrical connection is not illustrated so as to not obscure other elements in the figure) to an array of optoelectronic semiconductor devices 510, which in the illustrated example includes devices $515_1$-$515_x$. Each of the optoelectronic semiconductor devices $515_1$-$515_x$ comprises an amorphous substrate 205, a transparent and conductive oxide layer 210 having a cubic-oriented and/or rhombohedral-oriented surface and arranged on the amorphous substrate 205, and a nanorod array 215 arranged on the cubic-oriented and/or rhombohedral-oriented surface the transparent and conductive oxide layer 210. The nanorods of the nanorod array 215 comprise a group-III material and are non-polar. The non-polarity can be achieved by the nanorods having an a-plane or m-plane orientation. Additionally, if desired, each of optoelectronic semiconductor devices $515_1$-$515_x$ comprises a layer of group-III material arranged on the nanorod array 215. The layer of group-III material is non-polar (i.e., it has an a-plane or m-plane orientation). Although FIG. 5 illustrates an array of sixteen optoelectronic semiconductor devices, the array can have more or fewer optoelectronic semiconductor devices depending upon the application in which the system is employed.

As will be appreciated from the discussion above, the annealing of the transparent and conductive oxide layer provides a cubic-oriented and/or rhombohedral-oriented surface (exhibiting high crystallinity) so that the subsequent growth of the nanorod array comprising group-III materials, as well as the layer of group-III material grown on the nanorod array (if employed), is non-polar due to an a-plane or m-plane growth orientation. This results in the nanorods and the layer of group-III material grown on the nanorod array (if employed) being non-polar, which increases the device efficiency. Specifically, the a-plane or m-plane orientation increases the volume of the quantum well, which increases power output.

The discussion above uses the term nanorod. However, it should be appreciated that all references herein to a nanorod also refer to nanowires. Those skilled in the art appreciate that there are various definitions of the terms nanorods and nanowires and that some of these definitions are overlapping. Accordingly, equating the terms nanorods and nanowires herein is not contrary to conventional use of these terms because of the differing definitions currently employed by persons skilled in the art.

The disclosed embodiments provide optoelectronic semiconductor devices and methods for forming such devices. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

Reference 1: Q. Li, Y. Lin, J. R. Creighton, J. J. Figiel, and G. T. Wang, "Nanowire-templated lateral epitaxial growth of low-dislocation density nonpolar a-plane GaN on r-plane sapphire", *Advanced Materials* 21 2416-2421 (2009).

What is claimed is:

1. A method of forming an optoelectronic semiconductor device, the method comprising:
   providing an amorphous substrate;
   depositing a transparent and conductive oxide layer on the amorphous substrate;
   annealing the transparent and conductive oxide layer to form an annealed transparent and conductive oxide layer having a cubic-oriented and/or rhombohedral-oriented surface; and forming a nanorod array on the cubic-oriented and/or rhombohedral-oriented surface of the annealed transparent and conductive oxide layer, wherein the annealing of the transparent conductive oxide layer and the formation of the nanorod array are performed using molecular beam epitaxy, MBE, and wherein nanorods of the nanorod array comprise a group-III nitride material and are non-polar.

2. The method of claim 1, wherein the annealing of the transparent and conductive oxide layer occurs during the formation of the nanorod array.

3. The method of claim 1, further comprising:
forming a mask layer on the annealed transparent and conductive oxide layer prior to forming the nanorod array; and
removing the mask layer after forming the nanorod array.

4. The method of claim 1, wherein the transparent and conductive oxide is tin-doped indium oxide, ITO, or fluorine-doped tin oxide, FTO.

5. The method of claim 1, further comprising:
forming a layer of non-polar group-III nitride material on the nanorod array.

6. The method of claim 5, wherein the layer of group-III nitride material is formed using a molecular beam epitaxy, metal-organic chemical vapor deposition, liquid phase epitaxy, hydride vapor phase epitaxy sublimation, or plasma-enhanced chemical vapor deposition process.

7. The method of claim 1, further comprising:
thermally annealing the transparent and conductive oxide layer prior to annealing the transparent and conductive oxide layer using molecular beam epitaxy.

8. The method of claim 1, wherein the nanorods of the nanorod array have an a-plane or m-plane orientation.

9. The method of claim 1, wherein the transparent and conductive oxide layer is deposited using physical vapor deposition, e-beam evaporation, or sputter deposition.

10. An optoelectronic semiconductor device, comprising:
an amorphous substrate;
an annealed, transparent and conductive oxide layer having a cubic-oriented and/or rhombohedral-oriented surface and arranged on the amorphous substrate; and
a nanorod array directly grown on the cubic-oriented and/or rhombohedral-oriented surface of the annealed, transparent and conductive oxide layer, wherein nanorods of the nanorod array comprise a group-III nitride material and are non-polar,
wherein the nanorods of the nanorod array have an a-plane or m-plane orientation due to the cubic-oriented and/or rhombohedral-oriented surface of the annealed, transparent and conductive layer.

11. The optoelectronic semiconductor device of claim 10, further comprising:
a layer of group-III nitride material arranged on the nanorod array, wherein the layer of group-III material is non-polar.

12. The optoelectronic semiconductor device of claim 11, wherein the layer of group-III nitride material forms a light emitting diode.

13. The optoelectronic semiconductor device of claim 10, wherein each nanorod of the nanorod array is an individually-addressable, light emitting diode.

14. The optoelectronic semiconductor device of claim 13, wherein each nanorod of the nanorod array has a micron to sub-micron diameter.

15. The optoelectronic semiconductor device of claim 10, wherein the amorphous substrate is transparent.

16. The optoelectronic semiconductor device of claim 10, wherein the transparent and conductive oxide is tin-doped indium oxide, ITO, or fluorine-doped tin oxide, FTO.

17. An optoelectronic semiconductor system, comprising:
a voltage source; and
an array of optoelectronic semiconductor devices coupled to the voltage source, each of optoelectronic semiconductor devices comprises,
an amorphous substrate;
an annealed, transparent and conductive oxide layer having a cubic-oriented and/or rhombohedral-oriented surface and arranged on the amorphous substrate; and
a nanorod array directly grown on the cubic-oriented and/or rhombohedral-oriented surface of the annealed, transparent and conductive oxide layer, wherein nanorods of the nanorod array comprise a group-III nitride material and are non-polar,
wherein the nanorods of the nanorod array have an a-plane or m-plane orientation due to the cubic-oriented and/or rhombohedral-oriented surface of the annealed, transparent and conductive layer.

18. The optoelectronic semiconductor system of claim 17, wherein each of the optoelectronic semiconductor devices further comprise:
a layer of group-III nitride material arranged on the nanorod array, wherein the layer of group-III nitride material is non-polar.

* * * * *